United States Patent
Kwang et al.

(10) Patent No.: US 6,441,631 B1
(45) Date of Patent: Aug. 27, 2002

(54) PROCESSOR MODULE HEATSINK MOUNTING GUIDE POSTS FOR FUNCTION TEST

(75) Inventors: Loh Yeow Kwang; Chen Kah Shan; Koh Hock Chuan; Ke Siong Chew, all of Singapore (SG)

(73) Assignee: Advanced Micro Devices, Inc., Sunnyvale, CA (US)

( * ) Notice: Subject to any disclaimer, the term of this patent is extended or adjusted under 35 U.S.C. 154(b) by 53 days.

(21) Appl. No.: 09/585,338

(22) Filed: Jun. 2, 2000

(51) Int. Cl.[7] ............................................... G01R 31/02
(52) U.S. Cl. ..................................................... 324/760
(58) Field of Search ................................. 324/765, 761, 324/754, 158.1, 760; 439/73, 327, 330; 361/704, 715, 716, 719; 165/80.3, 80.4, 104.33, 185

(56) References Cited

U.S. PATENT DOCUMENTS

| | | | | |
|---|---|---|---|---|
| 6,157,539 A | * | 12/2000 | Wagner et al. | 361/704 |
| 6,205,023 B1 | * | 3/2001 | Moribe et al. | 361/704 |
| 6,219,241 B1 | * | 4/2001 | Jones | 361/704 |
| 6,332,792 B1 | * | 12/2001 | Lin et al. | 439/160 |

* cited by examiner

*Primary Examiner*—N. Le
*Assistant Examiner*—Etienne P LeRoux

(57) ABSTRACT

A processor test apparatus including a base and a plurality of guide posts attached to the base to retain a processor, wherein at least one of the plurality of guide posts includes a heat sink guide. A heat sink is provided and a heat sink clamp including a guide member is attached to the heat sink. The guide member moves within the heat sink guide to permit relative motion of the heat sink toward and away from a processor retained by the guide posts.

14 Claims, 3 Drawing Sheets

PROCESSOR MODULE HEATSINK MOUNTING GUIDE POSTS FOR FUNCTION TEST

FIELD OF THE INVENTION

The invention relates to a method and apparatus for testing electronic devices. Specifically, the invention relates to a method and apparatus for final functional system level testing of processors.

DESCRIPTION OF THE RELATED ART

Functional tests (FCT) are performed on a wide variety of processors to ensure that they are capable of performing their intended functions in an environment resembling as close as possible, an intended environment of the processor. Consequently, functional testing of the processor is often performed in a test station that possesses the basic setup of a targeted computer system, such as a personal computer. As shown in FIG. 1, this test station includes a base fixture 110, a motherboard 120, a heat sink 130 having a latch 140, and a processor to be tested 150. A plurality of card slots 160, such as memory card slots, are mounted in the motherboard 120 to appropriately configure the test station. Various other computer system components, such as a power supply and hard drive, necessary to build and configure a conventional computer system are known to those of skill in the art and are not elaborated upon herein.

In conventional functional tests, such as those using an Aavid™ heat sink designed for Athlon™ processor modules, a technician inserts processor 150 into position between guide posts 155 positioned at either end of the processor 150. The heat sink 130, often including a fan 135, is attached to the processor 150 using a latch 140 after a technician manually places the heat sink 130 in contact with the processor module 150. After attachment of the heat sink 130 to the processor 150, the functional test is performed. The functional test often involves simply booting up the processor 150 to be tested to ensure that it is able to support operation of an installed operating system, such as Windows™. If the processor 150 is able to load or boot up the operating system, the processor 150 passes the functional test. This usually occurs within about two minutes, but requires more or less time according to the processor 150 speed and operating system characteristics. If the processor 150 hangs up during the test, it fails the functional test.

However, the conventional functional test method and apparatus suffer from several problems. First, misalignment of the heat sink 130 causes less than optimal thermal transfer of heat away from the processor 150 to the heat sink 130. This misalignment causes the processor 150 to operate at a higher than nominal temperature and results in a higher failure rate than that of properly aligned heat sinks 130. Therefore, such misalignment adversely affects processor 150 throughput. Second, manual attachment of the heat sink 130 causes scratch marks on the processor 150 due to rubbing of the heat sink 130 against and/or latch 140 against the processor 150 during installation of the heat sink 130 against the processor 150. Although these scratch marks are not a functional concern, the appearance of the processor is compromised and sometimes results in a functional processor 150 being declared as a reject. Thus, scratch marks also affect processor 150 throughput.

SUMMARY OF THE INVENTION

Thus, a method and an apparatus is needed to improve processor functional test pass rates and throughput.

In one aspect, the invention provides a processor test apparatus comprising a base, a plurality of guide posts attached to the base to retain a processor, at least one of the plurality of guide posts including a heat sink guide, and a heat sink. A heat sink clamp having a guide member is attached to the heat sink. The heat sink guide member moves within a heat sink guide, permitting relative motion of the heat sink toward and away from a processor retained by the guide posts.

In another aspect, the invention provides a processor test apparatus comprising a base and a first guide post and a second guide post attached to the base in opposition to one another. Each guide post extends in a first direction, away from the base, and includes a respective first opening and second opening extending in a second direction substantially perpendicular to the first direction. Also included are a first heat sink clamp and a second heat sink clamp, each including a guide member insertable in a respective one of the first opening and second opening. The first heat sink clamp and second heat sink clamp, and a heat sink attachable thereto, are movable relative to the first guide post and second guide post by a corresponding movement of the guide members in the openings.

In yet another aspect, the invention provides a method for testing a processor comprising inserting a processor to be tested within a test station, sliding a heat sink module including at least one of a heat sink and a fan along a guide toward the processor to be tested, abutting the heat sink module against the processor to be tested, latching the heat sink module to the processor to be tested, and performing a functional test of the processor to be tested.

Additional features of the present invention will become readily apparent to those skilled in the art from the following detailed description, wherein only preferred embodiments of the invention are shown and described, simply by way of illustration of the best mode contemplated for carrying out the invention. As will be realized, the invention encompasses different embodiments, and its several details are capable of modifications in various obvious respects, all without departing from the invention. Accordingly, the drawings and description are to be regarded as illustrative in nature, and not as restrictive.

DESCRIPTION OF THE PRESENT INVENTION

Figure 1:
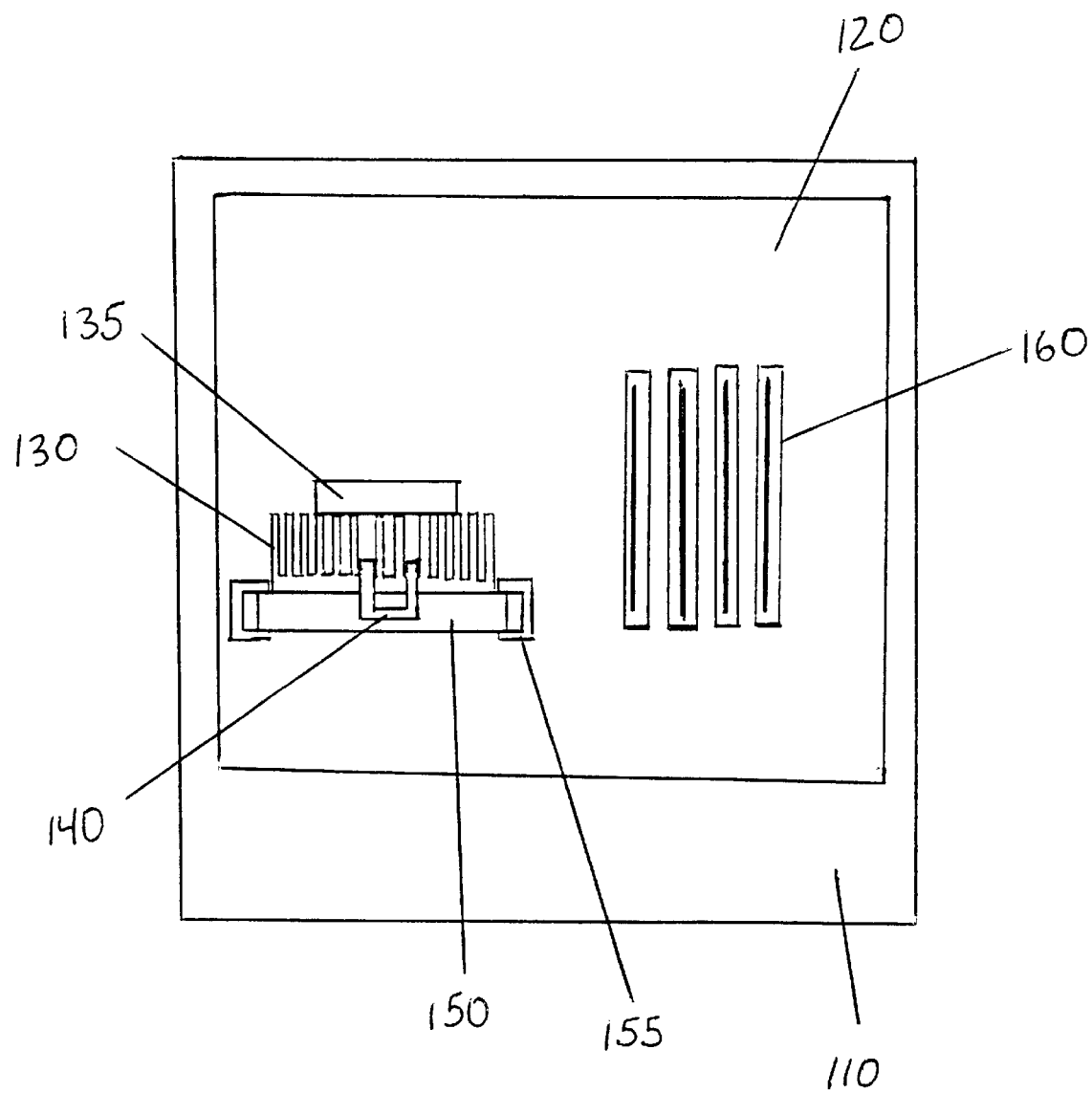
FIG. 1 is an illustration of a conventional functional test fixture.
Figure 2:
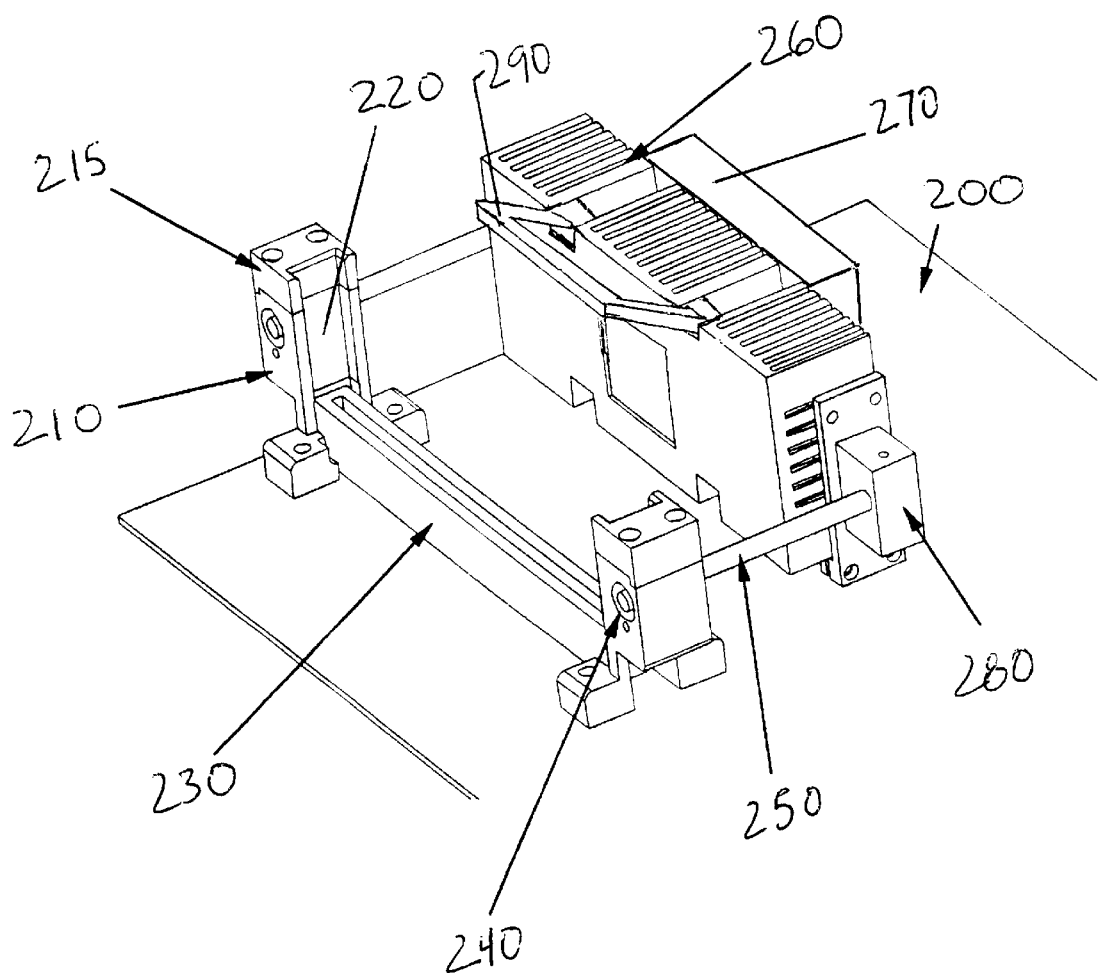
FIG. 2 is an isometric view of a heat sink mounting structure used to perform a processor functional test according to the invention.

Referring to FIG. 2, a portion of one embodiment of a processor functional testing apparatus is shown. In this embodiment, the processor test apparatus comprises a base, such as a motherboard 200.

Configured with this motherboard 200 are all cards, accessories, and equipment necessary to simulate an operating environment, or range of operating environments, that a given processor module would be expected to be exposed to during at least the initial stages of operation, including booting up the operating system. Naturally, this apparatus advantageously lends itself to other forms of functional testing, including longer duration steady state functional testing or processor burn-in testing.

Guide posts 210 are shown attached to the base 200, such as a motherboard, in opposition to one another and extending away from the base 200. A slot 230 serving as an electrical connector for a processor extends at least partially between the guide posts 210. FIG. 2 shows two guide posts 210; however, a number of guide posts may be employed for the same purpose, as will be understood by those skilled in the art. For example, four guide posts 210 could be used at each of the four corners of a substantially rectangular processor and still additional posts could be employed for less conventional processor geometries. Guide posts 210 have grooves 220 configured to retain the processor in a preferred orientation relative to electrical connector slot 230. The guide posts 210 are preferably made of aluminum, however, a variety of metals and plastics are suitable for the guide posts. It is also preferred that at least a top portion 215 of the guide posts 210 include a low friction material to facilitate insertion of a processor into the grooves 220. This top portion may be made of Torlon™ 5530 or Torlon™ 4203, for example, which exhibit a low coefficient of friction (i.e., approximately 0.2), high temperature resistance, high dimensional stability and is non-conductive. Alternately, a low friction coating could be applied to the grooves 220. Thus, the processor to be tested is insertable into the guide posts 210 without scratching the sides of the processor.

Guide posts 210 also include a heat sink guide 240. In one form, the heat sink guide 240 is a cylindrical opening in a guide post 210 extending in a direction substantially perpendicular to the guide post 210, wherein the opening in the guide post 210 contains a linear bushing (not shown) which permits movement of a guide member 250, such as a rod, therein. The heat sink guide 240 may take a variety of forms so long as the combination of the heat sink guide 240 and the guide member 250 permits controlled relative motion of a heat sink 260 toward and away from a processor to be tested. For example, the heat sink guide 240 could include a track disposed on the base 200 and the corresponding guide member 250 could include a member of a device configured to move freely along the track. Additionally, the heat sink guide 240 including an opening in the guide posts 210 may advantageously circumscribe only a portion of the guide member 250 and may permit motion along another axis, such as an axis of rotation.

As shown in FIG. 2, heat sink clamps 280 are attached to the heat sink 260 at opposite ends. Attached to, or integral with, each heat sink clamp 280 is a guide member 250 dimensioned to correspond to heat sink guide 240 such that the guide member 250 moves within the heat sink guide 240 to permit relative motion of the heat sink 260 toward and away from a processor retained by the guide posts 210. In one alternative embodiment, one heat sink clamp 280 is centrally attached on an underside of the heat sink 260 and includes a guide member 250 adapted to fit within or around a track disposed on the base 200. This track would optimally extend along a line perpendicular to a center point of the processor. Latch 290 may be attached to the heat sink 260 to facilitate retention of the heat sink 260 against a processor to be tested during testing, although the latch 290 could also be attached to the heat sink clamp 280 or the guide posts 210. A fan 270 is provided to facilitate heat transfer from the heat sink 260.

A method for testing a processor is illustrated in FIGS. 3(a) through 3(d). As described above, a test station configured to resemble a typical, or even atypical, setup of a computer system likely to utilize the tested processor, is used to test processors. In a functional test, for example, the processor is tested under operating conditions approximating that of an ultimate operating environment of the processor to determine whether or not the processor is functioning sufficiently to boot up an installed operating system, such as Windows NT™.

Figure 3A:
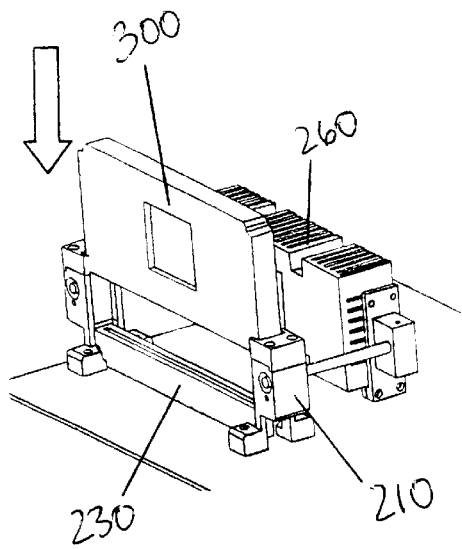
FIGS. 3(a)–3(d) are isometric views illustrating a method for testing a processor according to the invention.
Figure 3B:
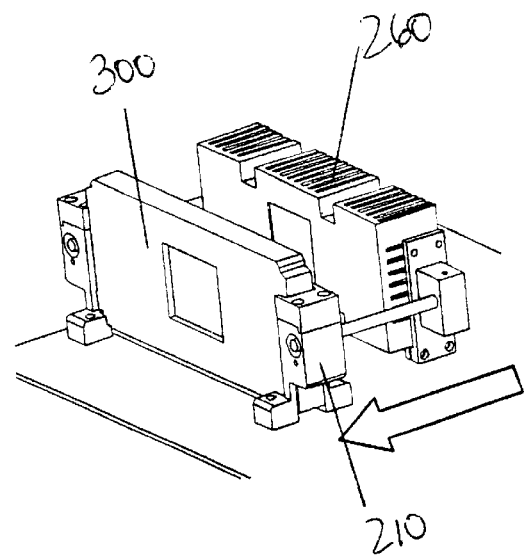
Figure 3C:
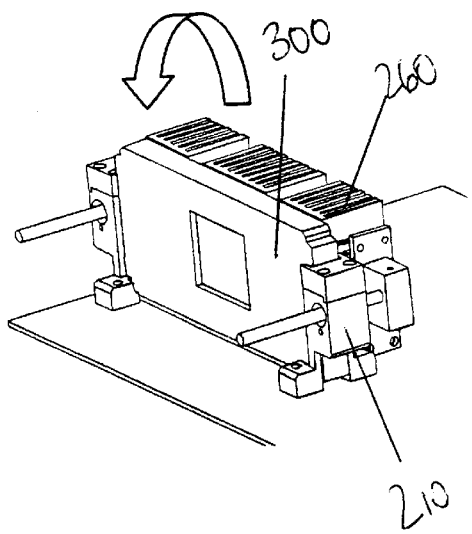
Figure 3D:
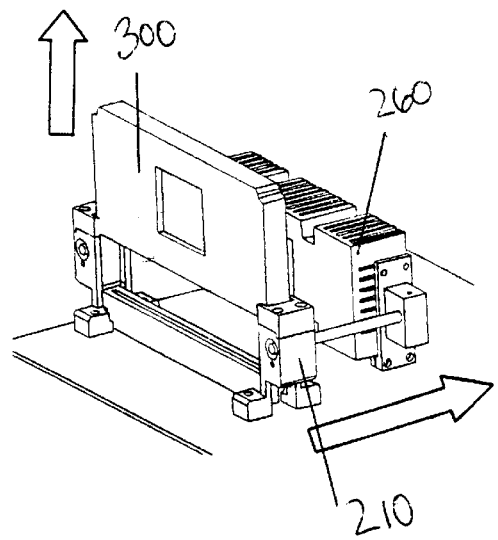

The method includes, first, inserting a processor 300 to be tested within a test station, such as by inserting processor 300 into position between guide posts 210 positioned at either end of processor 300, as seen in FIG. 3a. This step may additionally include connecting electrical connectors on processor 300 with electrical connectors embodied within or about slot 230 to permit transmission of signals to/from the processor 300 and the motherboard 200. Following insertion of the processor 300 in the test station, the method includes sliding a heat sink module 260, such as an Aavid™ heat sink designed for Athlon™ processor modules, which includes a heat sink and, preferably, a fan along a guide toward processor 300 to be tested, such as an Athlon™ processor module. This motion is depicted in FIG. 3b. The guide may include, for example, a heat sink guide 240 and a guide member 250. This sliding of the heat sink module 260 toward processor 300 is continued until the heat sink module 260 abuts against the processor 300 to be tested (FIG. 3c), whereupon the heat sink module 260 is secured in place, such as by latching the heat sink module 260 to the processor 300. The functional test of the processor 300 is performed and a determination is made as to whether the processor 300 satisfactorily completed the functional test. It is to be understood that the method contemplates continuing testing of a number of processors 300, necessitating additional steps of, for example, unlatching the heat sink module 260 from the tested processor 300, sliding the heat sink module 260 away from the tested processor 300, removing the tested processor 300 (FIG. 3d) and insertion of another processor to be tested. Additionally, this method may advantageously be used in additional forms of processor testing, such as those requiring attainment of a substantially steady state processor temperature or requiring attainment of such temperature and maintenance of such temperature for a specified time period.

Thus, the apparatus and method of the present invention provide simple and quick alignment of a heat sink module with a processor to be tested. A guide and guide member permit controlled relative motion of the heat sink toward and away from the processor to be tested, thus eliminating the disadvantages caused primarily by operator error in the conventionally employed method and apparatus, including ineffective heat transfer due to misalignment and cosmetic defects due to scratching of the processor by the latch or the posts. Thus, throughput and yield are improved.

Although the invention has been described with the example of an Athlon™ processor, it is to clearly understood that the invention may be employed with other types of processors and other types of semiconductor dies, such as ASICs or other digital logic circuitry.

The invention has described several aspects of the present invention to illustrate modes contemplated for carrying out the invention defined by the claims. As will be realized, the invention is capable of other and different embodiments, and its several details are capable of modifications in various obvious respects, all without departing from the invention and the drawings and description are to be regarded as illustrative in nature. Accordingly, the present invention is not limited by the specific aspects presented and described herein and is instead defined by the claims.

What is claimed is:

1. A semiconductor die test apparatus comprising, in combination:
   a base;
   a plurality of guide posts attached to the base to receive a semiconductor die module, at least one of the plurality of guide posts including a heat sink guide;
   a heat sink comprising a guide member and a latch; and
   a slot bearing an electrical connector disposed between the guide posts,
   wherein the guide member slides within the heat sink guide to permit relative motion of the heat sink toward a semiconductor die module retained by the guide posts prior to a semiconductor die test and away therefrom after completion of a semiconductor die test,
   wherein a semiconductor die module received by the guide posts is electrically connected to an electrical connector during a semiconductor die test, and
   wherein said latch is configured to fixedly attach said heat sink to a semiconductor die module during a semiconductor die test.

2. A semiconductor die module test apparatus according to claim 1, wherein each guide post includes a groove to receive a semiconductor die module.

3. A semiconductor die module test apparatus according to claim 2, wherein the guide member is rod-shaped, and wherein the heat sink guide comprises a linear bushing.

4. A semiconductor die module test apparatus according to claim 1, further comprising, in combination:
   a plurality of heat sink clamps attached to opposite ends of the heat sink, each heat sink clamp having a rod shaped guide member,
   wherein the heat sink guide comprises a linear bushing disposed within each guide post.

5. A semiconductor die module test apparatus according to claim 4, further comprising, in combination:
   a slot bearing an electrical connector disposed between the guide posts,
   wherein a semiconductor die module received by the guide posts is electrically connected to the electrical connector.

6. A semiconductor die module test apparatus according to claim 4, wherein the base comprises a motherboard.

7. A semiconductor die module test apparatus according to claim 3, wherein at least a portion of each of the grooves has a coefficient of friction less than approximately 0.2.

8. A semiconductor die module test apparatus according to claim 3, further comprising, in combination:
   a latch on at least one of the heat sink, the heat sink clamp, and the guide posts to detachably connect the heat sink to a semiconductor die module.

9. A semiconductor die module test apparatus according to claim 3, wherein the semiconductor die module is a microprocessor module.

10. A semiconductor die module test apparatus according to claim 1, wherein said heat sink comprises a first heat sink clamp and a second heat sink clamp, each including a guide member configured for sliding movement within a respective guide post heat sink guide.

11. A method for testing a semiconductor die module, the method comprising:
    inserting a semiconductor die module to be tested within a test station;
    sliding a heat sink module including at least one of a heat sink and a fan along a guide toward the semiconductor die module to be tested;
    abutting the heat sink module against the semiconductor die module to be tested; and
    performing a functional test of the semiconductor die module to be tested.

12. A method for testing a semiconductor die module according to claim 11, further comprising:
    sliding the heat sink module away from the semiconductor die module tested;
    removing a tested semiconductor die module, and
    inserting another semiconductor die module to be tested within the test station.

13. A method for testing a semiconductor die module according to claim 11, further comprising:
    latching the heat sink module to the semiconductor die module to be tested prior to the functional test; and
    unlatching the heat sink module from the semiconductor die module tested subsequent to the functional test.

14. A method for testing a semiconductor die module according to claim 12,
    wherein performing the functional test includes achieving a substantially steady state semiconductor die module temperature.

* * * * *